United States Patent
Stollenwerk

(10) Patent No.: US 7,165,506 B2
(45) Date of Patent: Jan. 23, 2007

(54) METHOD AND DEVICE FOR PLASMA-TREATING THE SURFACE OF SUBSTRATES BY ION BOMBARDMENT

(75) Inventor: Johannes Stollenwerk, Rösrath (DE)

(73) Assignee: Cobes GmbH Nachrichten- und Datentechnik, Weisweil (DE)

( * ) Notice: Subject to any disclaimer, the term of this patent is extended or adjusted under 35 U.S.C. 154(b) by 130 days.

(21) Appl. No.: 10/204,618

(22) PCT Filed: Feb. 26, 2001

(86) PCT No.: PCT/DE01/00762

§ 371 (c)(1),
(2), (4) Date: Aug. 21, 2002

(87) PCT Pub. No.: WO01/65587

PCT Pub. Date: Sep. 7, 2001

(65) Prior Publication Data

US 2003/0010747 A1 Jan. 16, 2003

(30) Foreign Application Priority Data

Mar. 3, 2000 (DE) ............... 100 10 126

(51) Int. Cl.
*H01L 21/00* (2006.01)
(52) U.S. Cl. .............. 118/723 HC; 118/723 DC; 118/723 E; 156/345.43
(58) Field of Classification Search .......... 156/345.43, 156/345.46, 345.47, 345.44, 345.45; 118/723 R, 118/723 EB, 723 CB, 723 E, 723 HC, 723 DC; 216/71, 70, 67; 315/111.21
See application file for complete search history.

(56) References Cited

U.S. PATENT DOCUMENTS 4,149,024 A * 4/1979 Stenkvist et al. .......... 373/107

(Continued)

FOREIGN PATENT DOCUMENTS

DE    657 903    3/1938

(Continued)

OTHER PUBLICATIONS

Yasuda et al.; Dual-function remote plasma etching/cleaning system applied to selective etching of $SiO_2$ and removal of polymeric residues; J. Vac. Sci. Technol. A 11 (5) Sep./Oct. 1993, pp. 2496-2507.

(Continued)

*Primary Examiner*—Parviz Hassanzadeh
*Assistant Examiner*—Michelle Crowell
(74) *Attorney, Agent, or Firm*—Gudrun E. Huckett

(57) ABSTRACT

In an ion etching method for reducing a substrate thickness, an electric arc is generated in a vacuum chamber such that the electric arc is locally separated from the substrate and circulates about the substrate. A plasma of a supplied etching gas is produced by the electric arc, and the ions of the etching gas are accelerated onto the substrate by an electric potential. The employed device has a vacuum chamber, an etching gas supply, and first and second electrodes supplied with direct or alternating voltage for generating the electric arc that produces the plasma of the etching gas. The first electrode is ring-shaped and the second electrode is arranged centrally to the ring of the first electrode. A magnetic coil creates a migrating magnetic field such that the electric arc is locally separated from the substrate and circulates about the substrate in a carousel fashion.

9 Claims, 1 Drawing Sheet

U.S. PATENT DOCUMENTS

| | | | |
|---|---|---|---|
| 4,612,477 A * | 9/1986 | Dothan | 315/111.21 |
| 4,620,913 A * | 11/1986 | Bergman | 204/192.1 |
| 4,673,477 A | 6/1987 | Ramalingam et al. | |
| 4,769,101 A * | 9/1988 | dos Santos Pereiro Ribeiro | 156/345.39 |
| 4,803,405 A * | 2/1989 | Nakano et al. | 315/111.21 |
| 5,094,878 A | 3/1992 | Yamamoto et al. | |
| 5,120,568 A * | 6/1992 | Schuurmans et al. | 427/488 |
| 5,306,407 A * | 4/1994 | Hauzer et al. | 204/192.38 |
| 5,535,905 A | 7/1996 | Harris | |
| 5,777,438 A * | 7/1998 | Suzuki | 315/111.81 |
| 5,837,958 A | 11/1998 | Förnsel | |
| 6,033,734 A | 3/2000 | Muenz et al. | |
| 6,051,114 A * | 4/2000 | Yao et al. | 204/192.3 |
| 6,106,074 A * | 8/2000 | Chang | 301/5.301 |
| 2004/0011467 A1* | 1/2004 | Hemker et al. | 156/345.49 |

FOREIGN PATENT DOCUMENTS

| | | |
|---|---|---|
| EP | 0 459 137 | 12/1991 |
| EP | 0 480 689 | 4/1992 |
| EP | 0 711 847 | 5/1996 |
| GB | 2049560 A * | 12/1980 |
| JP | 05306192 A * | 11/1993 |

OTHER PUBLICATIONS

Meiners et al.; Surface modification of polymer materials by transient gas discharge at atmospheric pressure; Surface and Coating Technology 98 (1998) 1121-1127.

* cited by examiner

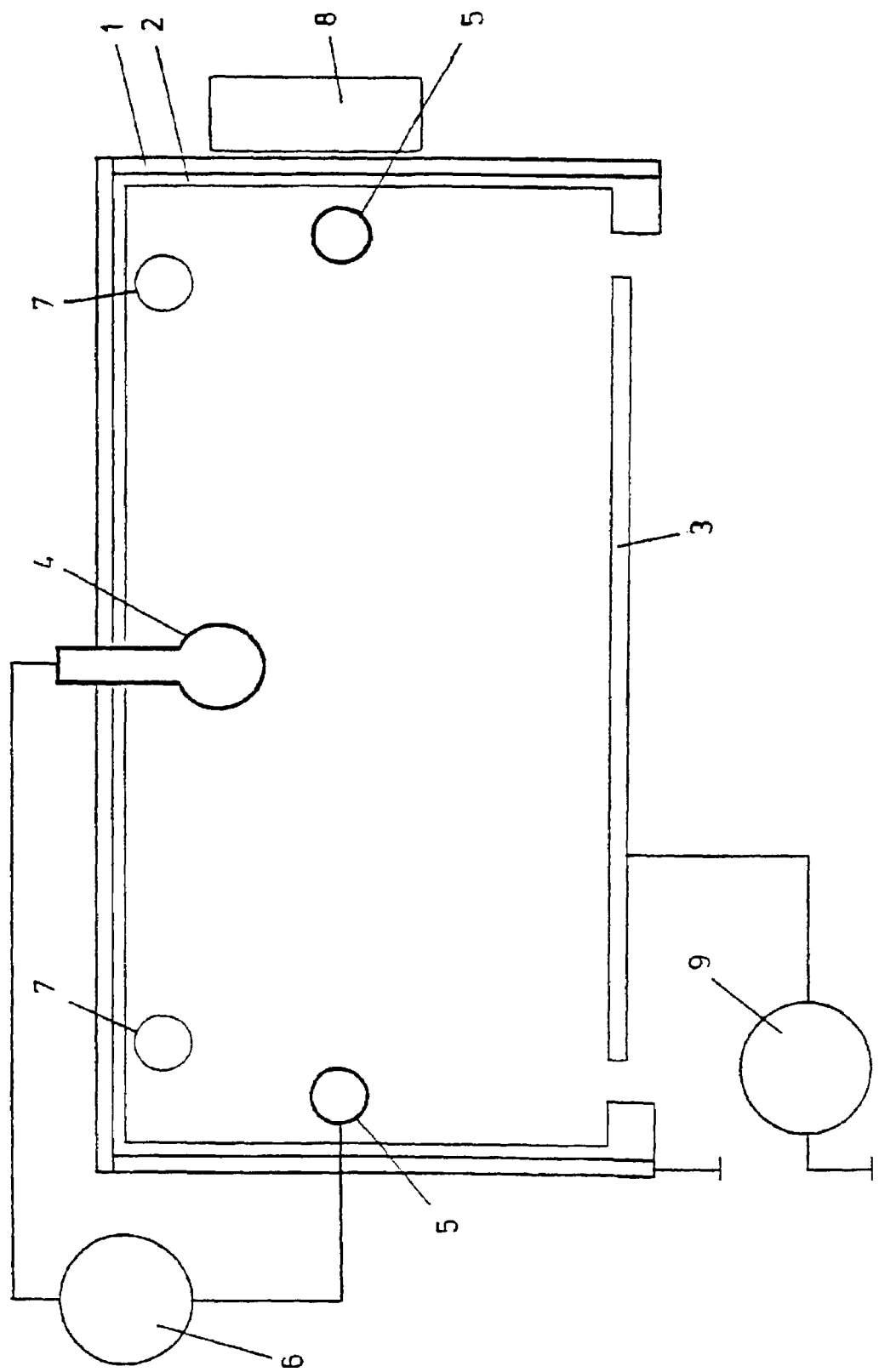

METHOD AND DEVICE FOR PLASMA-TREATING THE SURFACE OF SUBSTRATES BY ION BOMBARDMENT

BACKGROUND OF THE INVENTION

1. Field of the Invention

The invention relates to a method for plasma treatment of the surface of substrates by ion bombardment wherein a plasma of a supplied gas is generated and wherein the ions are accelerated by an electric potential onto the substrate. Moreover, the invention relates to a device for performing the method, comprising a vacuum chamber as well as comprising a gas supply.

2. Description of the Related Art

A first field of application of the method according to the invention as well as of the corresponding device is the manufacture of extremely thin wafers which are more and more in demand. Their advantages lie in the excellent heat dissipation of an integrated circuit (IC) as well as material savings for the chip card industry. With the currently known ion etching methods, however, only those chips can be produced which are relatively thick and therefore can easily break when they are integrated, for example, into a banking card.

The basic principle of ion etching methods resides in that a plasma of a supplied etching gas is generated. By connecting the substrate to be treated to a negative voltage potential, the ions are accelerated onto the substrate and erode the surface of the substrate in this way. In the known methods, the plasma is generated by high frequency introduction into the etching gas or by a microwave coupling system or in another comparable way. However, the ionization rate resulting from these methods for generating the plasma is relatively minimal and, correspondingly, the efficiency of the method for reducing the thickness of substrates by ion etching is unsatisfactory.

Nevertheless, the method upon which the invention is based is also suitable for and useable with other substrates, for example, according to a further field of application, for plasma activation of the surfaces of substrates which are plastic bodies, in particular, films. This plasma activation of the surface provides the basis for applying a bonding agent.

SUMMARY OF THE INVENTION

Based on this, it is an object of the invention to provide a productive method with a high degree of efficiency for plasma treating the surface of substrates by ion bombardment; moreover, a device for performing the method is to be provided.

According to the invention a technical solution is proposed with regard to the method in that the plasma is generated by an electric arc.

In this connection, in a vacuum chamber an electric arc is ignited by direct current or alternating current. By coupling the current and providing a pressure pulse, generated in the vacuum chamber, a very high current density is generated which is sufficient to ignite between corresponding electrodes a high current electric arc (ARC) and to allow it to burn stably. In this way, a very high ionization rate is generated.

As already mentioned before, the electric arc can be ignited and maintained by alternating voltage. According to this alternating current operation of the electric arc the frequency can vary between 1 Hz and 4 MHz, wherein a process optimum is obtained for approximately 1.765 MHz.

As an alternative, the electric arc can be ignited and maintained also by direct voltage.

A preferred embodiment is proposed wherein the electric arc is caused to migrate within the vacuum chamber; the advantage resides in that the migration of the electric arc avoids spot overheating. The migration provides a separation of substrate and electric arc. This is technically realized by a migrating magnetic field penetrating the vacuum chamber by which the electric arc is guided like a carousel in a circulating movement.

A further embodiment is proposed wherein the substrate is connected to a negative pulsed voltage potential, in particular, direct voltage potential, the basic idea residing in a pulsed direct-current bias (DC bias). The frequency of the pulsed direct-current source is variable in the range between 1 Hz and 1 MHz, wherein the best working point is approximately at 225 KHz. The basic idea resides in that the ions produced by the electric arc are accelerated onto the substrate by means of a voltage pulse.

Another embodiment is suggested wherein the substrate is connected to a positive voltage potential between the negative voltage pulses. The basic idea resides in that partial volume charges, that have been generated and would otherwise disturb the supplied negative potential, can be removed by means of the positive voltage potential. The volume is thus discharged and charge carriers are eliminated. Preferably, the positive counter pulse is shorter than the negative voltage pulsed.

A first application of the method according to the invention for plasma treatment of the surface of substrates by ion bombardment is a plasma dry etching method for thinning substrates, for example, finish-processed wafers, by ion etching and an etching gas which method is assisted by an electric arc (ARC) and operates with a high degree of efficiency. Accordingly, the requirement with respect to extremely thin wafers can be fulfilled, wherein the advantages of this wafer reside in the excellent dissipation of the heat of an integrated circuit (IC), furthermore in material savings for manufacturing the chips, as well as, finally, in a high stability of the chips because they are thin and therefore very flexible. In comparison to conventional methods, the inventive etching method enables as a result of the high ionization rates shorter etching times and reduced costs per article.

In order to obtain the desired and required extremely high ionization and etching rate, fluorine compounds can be used, in particular, $SF_6$, $NF_3$, $CF_4$ or $C_3F_8$. They not only effect a high ionization and etching rate for silicon but also for $SiO_2$, $Si_3N_4$, Al, MO, Ta, Ti and W.

A second application of the method according to the invention for plasma treatment of the surface of substrates by ion bombardment is proposed for the purpose of plasma activation of the surface of substrates. In this way, a surface activation with a very high efficiency is possible as a result of the high ionization rate.

The technical solution according to the invention for the device for performing the method is characterized in that in the vacuum chamber (1) two electrodes (4, 5) are arranged between which a direct voltage or an alternating voltage can be applied for generating an electric arc.

The basic configuration of the device is comprised of a vacuum chamber in which at least two pairs of electrodes are arranged between which the electric arc is ignited. In this connection, the introduced current conductors are insulated relative to the vacuum chamber wherein different ceramic materials can be used as insulators.

According to one particular embodiment, the first electrode is of an annular shape and the second electrode is arranged approximately on the center axis of the ring of the first electrode so that the electric arc is generated between a central electrode and an annular electrode. In this way, a very simple electrode arrangement is provided in order to realize the aforementioned carousel-like circulation of the electric arc so that overall reproducible conditions are ensured in all radial directions.

In this way, the gas supply can be embodied as an approximately annular pipe which is essentially concentrically arranged about the central electrode. As an alternative, it is also conceivable to provide the chamber with several individuals supply nozzles.

A further embodiment in regard to the configuration of the vacuum chamber proposes that the inner wall of the vacuum chamber comprises hot-pressed boron nitride.

Finally, the vacuum chamber has correlated therewith a magnetic coil; this has the advantage that by means of the field coils arranged external to the vacuum chamber the circulation of the electric arc can be realized in a technically simple way.

BRIEF DESCRIPTION OF THE DRAWINGS

One embodiment of the invention in the form of a device for reducing the thickness of substrates, i.e., of a wafer, by ion etching will be described with reference to the drawing which illustrates a schematic longitudinal section of the device.

DESCRIPTION OF PREFERRED EMBODIMENTS

The etching module has a cylindrical vacuum chamber 1. It is provided at its inner side with a coating 2 of hot-pressed boron nitride. The substrate 3 in the form of a wafer to be treated is positioned in the lower area of this vacuum chamber 1.

In the central cover area a first electrode 4 is positioned within the vacuum chamber 1. In the wall area of the vacuum chamber 1 a second annular electrode 5 is arranged concentrically thereto. Both electrodes 4, 5 are connected to an alternating voltage supply which operates variably in the frequency range between 1 Hz and 4 MHz. Moreover, above the annular electrode 5 a gas supply 7 in the form of an annular pipe is arranged which has outlet nozzles distributed about the circumference for an etching gas which, in particular, is a fluorine compound.

Annular magnetic coils are arranged external to the vacuum chamber 1 for generating a rotating magnetic field.

Finally, the substrate 3 is connected to a voltage source 9 for generating a negative pulsed direct-current bias (pulsed DC bias) which operates in the frequency range between 1 Hz and 1 MHz.

The function of the etching module is as follows.

The vacuum chamber 1 is evacuated to a pressure between 0.001 and 10 mbar wherein the preferred working pressure is approximately 0.5 mbar. Other pressures are also conceivable.

By means of the gas supply 7 etching gas in the form of a fluorine compound is introduced into the vacuum chamber 1. Since an alternating voltage or direct voltage is present between the two electrodes 4, 5, an electric arc with a plasma between these two electrodes 4, 5 is generated. The magnetic coils 8 are activated such that the electric arc circulates like a carousel along the annular electrode 5.

As soon as the voltage source 9 releases a negative voltage pulse, the ions of the plasma are accelerated onto the substrate 3. Upon impinging of the ions on the top surface of the substrate 3, this surface is etched, i.e., eroded, and this for so long until the desired thickness is reached. Between the negative direct voltage pulses of the voltage source 9, positive, preferably shorter, direct voltage pulses are generated. They cause the partial volume charges to be removed so that the subsequently supplied negative potential is not disturbed by a possibly present volume charge.

The method according to the invention resides thus in the separation of plasma and electric arc as well as of substrate 3 and electric arc. The electric arc, supplied by an electric power supply, serves as an ionization source for the plasma whose ions are then accelerated by a second pulsing voltage onto the substrate 3. The separation of substrate 3 and electric arc is realized by the migrating magnetic field. In this way, the electric arc is not accelerated onto the substrate 3. The electric arc and the substrate 3 are separated from one another. The electric arc serves for generating the plasma.

The advantage of this etching module for large-surface processing resides in that, in comparison to the prior art, a much higher etching rate/eroding rate can be achieved by means of the extremely high ionization rate and the negative pulsed direct current bias (pulsed DC bias). This results in very short etching times and thus reduced costs per article in comparison to the prior art. Overall, it is thus possible to produce extremely thin wafers which are characterized by excellent heat dissipation of the integrated circuit (IC), moreover by material savings for the chip card industry, and, finally, by enabling flexible chips which can be embedded without problems in banking cards, without there being the risk of them breaking when under bending load.

Further applications are conceivable, for example, the plasma activation of surfaces of substrates.

LIST OF REFERENCE NUMERALS

| | |
|---|---|
| 1 | vacuum chamber |
| 2 | coating |
| 3 | substrate |
| 4, 5 | electrodes |
| 6 | alternating voltage source |
| 7 | gas supply |
| 8 | magnetic coils |
| 9 | voltage source |

The invention claimed is:

1. A device for reducing a thickness of a substrate by ion etching; the device comprising:

a vacuum chamber (1);

an etching gas supply for supplying an etching gas to the vacuum chamber;

a first electrode and a second electrode;

wherein the first electrode (5) has a shape of a ring;

wherein the second electrode (4) is arranged approximately on a center axis of the ring of the first electrode (4);

wherein a substrate is arranged symmetrically on the center axis of the ring of the first electrode;

wherein the first and second electrodes, viewed in an axial direction of the center axis of the ring of the first electrode, are arranged between the etching gas supply and the substrate;

wherein the first and second electrodes are configured to be supplied with a direct voltage or alternating voltage for producing a plasma of the etching gas by an electric arc that is locally separated from the substrate;

wherein ions of the etching gas are accelerated by an electric potential supplied to the substrate such onto the substrate that a surface of the substrate is etched and a thickness of the substrate is reduced;

magnetic coils (8) correlated with the vacuum chamber (1) and arranged in a ring shape;

activation means activating the magnetic coils to create a rotating magnetic field such that the electric arc, produced between the first and second electrodes and locally separated from the substrate, circulates along the first ring-shaped electrode in a carousel fashion.

2. The device according to claim 1, wherein the gas supply (7) is an approximately annular pipe.

3. The device according to claim 1, wherein the vacuum chamber (1) has an inner wail comprising hot-pressed boron nitride.

4. The device according to claim 1, wherein the alternating voltage for generating the electric arc is ignited and maintained at a frequency between 1 Hz and 4 MHz.

5. The device according to claim 1, wherein the electric arc is ignited and maintained by direct current.

6. The device according to claim 1, wherein the electric potential supplied to the substrate is a negative pulsed voltage potential so that the substrate is subjected to negative voltage pulses, wherein the negative pulsed voltage potential has a frequency between 1 Hz and 1 MHz.

7. The device according to claim 6, wherein the negative pulsed voltage potential is a direct voltage potential.

8. The device according to claim 6, wherein the substrate is connected to a positive voltage potential between the negative voltage pulses.

9. The device according to claim 1, wherein the etching gas is a fluorine compound selected from the group consisting of $SF_8$, $NF_3$, $CF_4$ and $C_3F_8$.

* * * * *